United States Patent [19]

Weiner

[11] 4,185,244

[45] Jan. 22, 1980

[54] HIGH VOLTAGE NANOSECOND PULSER USING A REPETITIVE SERIES INTERRUPTER

[75] Inventor: Maurice Weiner, Ocean Township, Monmouth County, N.J.

[73] Assignee: The United States of America as represented by the Secretary of the Army, Washington, D.C.

[21] Appl. No.: 895,421

[22] Filed: Apr. 12, 1978

[51] Int. Cl.$^2$ .......................... H03K 3/86; H03K 3/55
[52] U.S. Cl. ....................................... 328/67; 328/65; 315/289
[58] Field of Search ...................... 328/65, 67; 315/189

[56] References Cited

U.S. PATENT DOCUMENTS

| | | | |
|---|---|---|---|
| 2,946,958 | 7/1960 | Bonia et al. ............................. | 328/65 |
| 3,320,476 | 5/1967 | Beese ..................................... | 315/289 |
| 3,337,755 | 8/1967 | Grabowski et al. ................. | 328/67 X |
| 4,051,439 | 9/1977 | Nyswander ......................... | 328/67 X |

OTHER PUBLICATIONS

Research & Development Technical Report Ecom-4469 "Repetitive Series Interrupter" by M. Weiner, Feb. 1977.
Proceedings IEEE International Pulsed Power Conference Nov. 9, 10 & 11, 1976, 76CH1147-8 Region 5, the following papers are pertinent: 11D1-1 to 11D1-6; 11D2-1 to 11D2-5; 11D3-1 to 11D3-6; 11D4-1 to 11D4-6; 11D5-1 to 11D5-6; 11D6-1 to 11D6-8; & 11D7-1 to 11D7-6.

Primary Examiner—John S. Heyman
Attorney, Agent, or Firm—Nathan Edelberg; Sheldon Kanars; Daniel D. Sharp

[57] ABSTRACT

A pulse generation system using an inductive energy storage technique is described. A high magnitude current flowing in a storage inductor is suddenly halted by means of a repetitive series interrupter device and an accompanying magnetic field coupled control circuit. The resulting high voltage generated causes breakdown across a spark gap and transmission of a high energy pulse to a load.

6 Claims, 6 Drawing Figures

HIGH VOLTAGE NANOSECOND PULSER USING A REPETITIVE SERIES INTERRUPTER

The invention described herein may be manufactured and used by or for the Government for governmental purposes without the payment of any royalties thereon or therefor.

BACKGROUND OF THE INVENTION

1. Field of the Invention

This invention relates to pulse generation systems, and, more particularly, to high voltage pulse generation using inductive energy storage.

2. Description of the Prior Art

Many recent advances in modern technological fields such as high energy laser systems and beam accelerator apparatus have been made possible by concurrent advances in the art of high energy pulsed power sources. The spark gap radio transmitter used for Morse code communications at the beginning of this century is an example of early attempts in this art area.

One well-known approach for obtaining very high voltage pulses involves the charging of a bank of high voltage capacitors in parallel with a high voltage source. Once charged, the capacitors are disconnected from the source, reconnected in series, and discharged across a load. This technique, though suitable for some applications, has several drawbacks, such as the large weight, size and expense of the capacitors needed for high energy storage.

The serious limitations of capacitive high voltage systems have stimulated appreciable research regarding the use of inductive energy storage as a means for aiding in the production of high energy pulses. A good synopsis of the recent work being done in this area is provided in the Proceedings of the I.E.E.E. International Pulsed Power Conference, (November, 1976). The papers in the Proceedings discuss the advantages and theory of inductive energy storage and discharge methods including principles of charging and discharging efficiency, use of exploding foil fuses, energy transfer from inertial energy storage flywheels to inductive storage, superconducting magnetic systems, and multiple inductor storage systems.

None of these papers propose a method or apparatus for providing the desirable combination of high energy, narrow width pulses with a high repetition rate.

Applicant has done appreciable research in the area of high voltage systems, including a course of study and experiments which resulted in the publication of his paper "Research and Development Technical Report 4469," U.S. Army Electronics Command, February, 1977, entitled "Repetitive Series Interrupter." As described in that report, the basic nature and design of the repetitive series interrupter (RSI) has been publicly known for many years. The RSI is a gas filled device that is basically a thyratron with a long discharge region (i.e., magnetic interaction column). When a sufficiently strong magnetic field is directed transverse to its interaction column, the conduction plasma in the device is extinguished, thereby suddenly interrupting the current. In the past, the RSI has been used mainly for the protection of high voltage microwave tubes against arcs.

It is an object of the instant invention to provide an improved high energy pulser employing inductive energy storage, and using to advantage the special characteristics of the repetitive series interrupter.

SUMMARY OF THE INVENTION

The invention is directed to a high voltage pulse train generation system using inductive energy storage and magnetic field controlled electronic switching. A voltage source is placed in series with a storage inductor, a spark gap, and a load device. A repetitive series interrupter (RSI) is placed across the series combination of the spark gap and load. A special magnetic field pulse generation network is used to supply large magnetic pulses which interrupt the current flowing in the RSI at regular intervals of time. During each current interruption period, a high voltage is generating across the spark gap. When the spark gap voltage develops to a sufficiently high level, the spark gap is caused to break down and a high energy electrical pulse is thus applied to the load.

DETAILED DESCRIPTION

Figure 1:
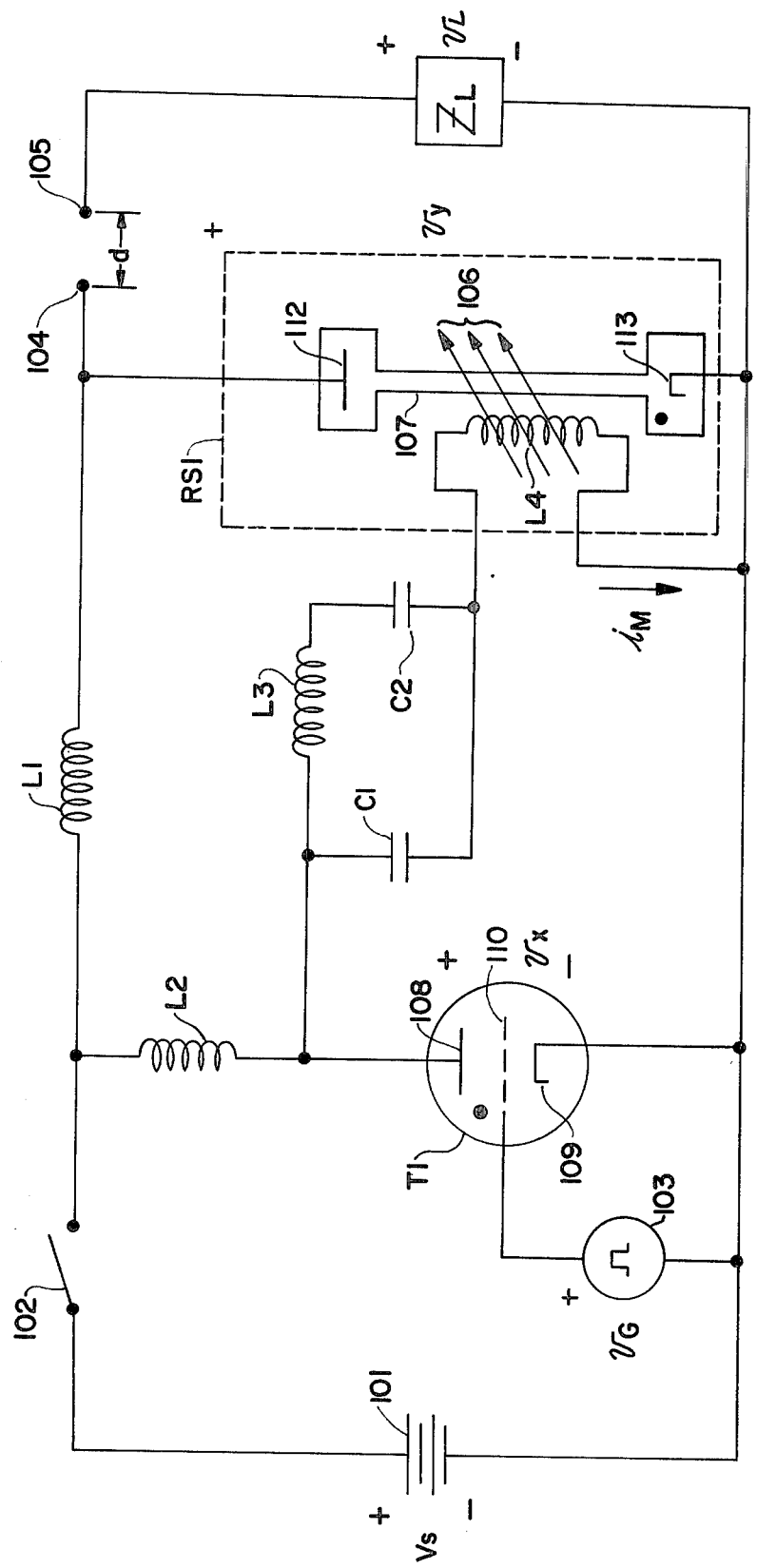
FIG. 1 shows a circuit diagram of the preferred embodiment of the instant invention.

Referring now to FIG. 1, we see the perferred embodiment of the instant invention in which a power supply for the circuit is voltage source 101. This source 101 will normally have a voltage of at least several kilovolts and a current supplying capability in the range of 50–500 amperes. Connected to the source 101 through a switch 102 is storage inductor L1. This storage inductor is of a design capable of withstanding the high current and voltage levels mentioned above.

Inductor L2 is a charging inductor for a magnetic field pulse generation network, the operation of which will be discussed later below.

Tube T1 is a gas filled thyratron. As is well-known in the art, this tube acts essentially as an open circuit until a positive grid pulse voltage $v_G$ is applied to the control grid 110, at which point the tube begins conduction and the voltage $v_X$ across it drops to a low magnitude known as the tube's conduction voltage. The tube T1 conducts at this low value of voltage over a broad range of current flowing from anode 108 to cathode 109. When this current decreases to substantially zero the tube ceases conduction and again approximates an open circuit. In this circuit the control voltage is provided by grip pulse voltage source 103 which has a peak value $V_G$. The value of this grid voltage has negligible effect upon the conduction voltage of the thyratron T1.

A spark gap, as depicted in FIG. 1 by nodes 104 and 105, is situated between storage inductor L1 and a load impedance $Z_L$. The voltage necessary to cause breakdown and conduction across this gap is directly proportional to the distance d between nodes 104 and 105. In this embodiment the gap is a simple air gap.

$Z_L$ is an electrically conductive impedance to which high voltage electrical pulses are intended to be applied.

A repetitive series interrupter (RSI), shown within the dotted rectangle of FIG. 1, is a magnetic field controlled electronic current conduction and interruption device. It is basically a gas filled tube with an anode 112, a cathode 113, a long magnetic interaction column 107, and a transverse magnetic field coil L4. The RSI has substantially the characteristics of an open circuit until the voltage $v_Y$ across it reaches the device's breakdown voltage. At that point the RSI begins conduction and the voltage $v_Y$ drops to a low magnitude "on" voltage $V_{yc}$. When a large pulse of current $i_M$ flows through the transverse magnetic field coil L4, the transverse magnetic field generated (as depicted by arrows 106) causes the conduction plasma within the RSI to be extinguished—thus suddenly interrupting the current flowing in the RSI. RSI devices of the type described above are currently available for operation at voltage levels up to 15 kilovolts and current levels up to 300 amperes.

A pulse forming network including storage capacitors C1, C2 and pulse shaping inductor L3, connects the tube T1 to the transverse magnetic field coil L4.

Figure 2A:
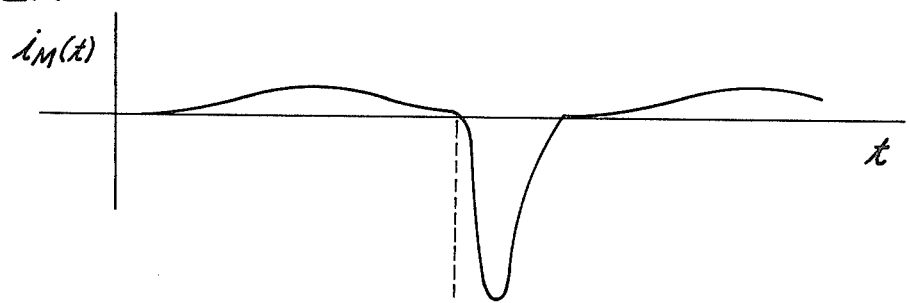
FIGS. 2A through 2E show typical voltage and current waveforms which occur during the operation of the circuit of FIG. 1.
Figure 2B:
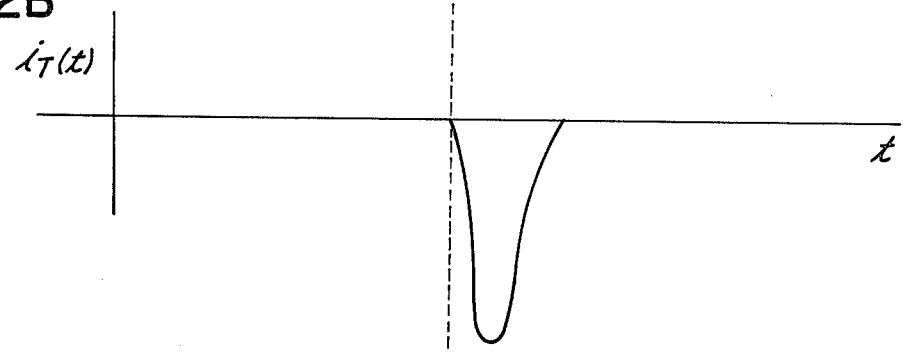
Figure 2C:
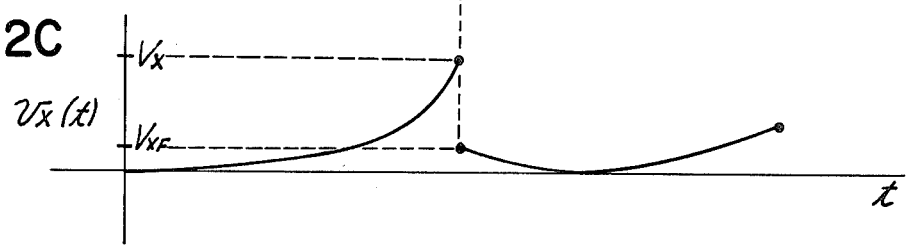
Figure 2D:
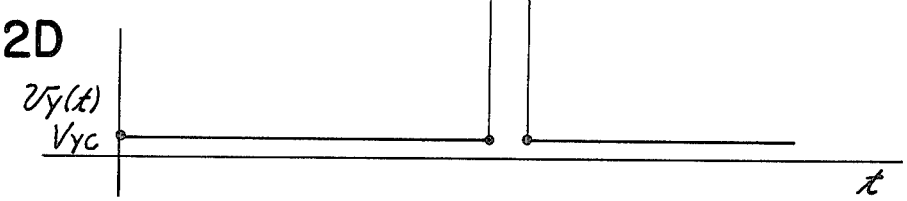

The overall operation of the combined circuit of FIG. 1 will now be explained. When switch 102 is closed, the RSI "fires" and $v_Y$ becomes a low "on" voltage $V_{yc}$ as shown in FIG. 2D. A voltage of magnitude $[V_s - V_{yc}]$ is thus impressed across storage inductor L1 causing a current to build up in L1 which is eventually limited by the internal resistances of L1 and voltage source 101.

Figure 2E:
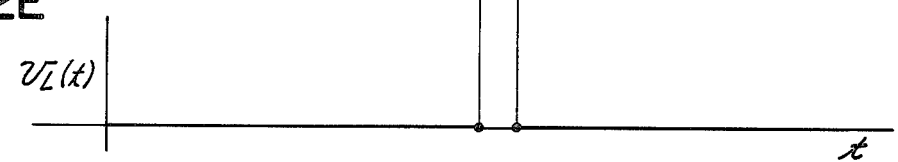

When a sufficiently high magnitude field (represented by arrows 106 in FIG. 1) is applied transverse to magnetic interaction column 107, the high magnitude current flowing through the RSI and the storage inductor L1 is suddenly extinguished. In keeping with the well-known expression for the voltage across an inductor, $v_L = L \, (di/dt)$ (where i is the current flowing through the inductor as a function of time, and L is the magnitude of the inductance), it is seen that the sudden decrease in inductor current causes the di/dt term to become very large in magnitude. The resulting large magnitude voltage generated across L1 adds to the supply voltage $V_s$, and their sum appears across the spark gap between nodes 104 and 105. Eventually, the gap voltage become so high that a spark jumps the gap and causes a high voltage pulse, as shown in FIGS. 2E and 2D, to be applied across load impedance $Z_L$ and the RSI. When the magnetic field applied across the magnetic interaction column decreases sufficiently, the RSI again begins to conduct, thus abruptly ending the voltage pulse applied to the load, as shown in FIG. 2E. This process continues repetitively until such time as switch 102 is opened.

For a full understanding of the invention, it will now be explained how the controlling magnetic field pulses are generated. As shown in FIG. 1, the magnetic pulses are produced by a thyratron T1, inductors L2 and L3, capacitors C1 and C2, field coil L4, and grid control voltage source 102. When switch 102 is closed, current flows through charging inductor L2, as well as through charge storage capacitors C1 and C2, pulse shaping inductor L3, and transverse magnetic field coil L4. A typical time waveform of total charging current $i_M$ is shown in FIG. 2A. When the capacitors become sufficiently charged, the thyratron T1 is triggered into conduction by applying grid pulse voltage $v_G$, so that the voltage across T1 drops abruptly from $V_{XC}$ to the low valve $V_{XF}$ as shown in FIG. 2C. The charge storage capacitors C1 and C2 then discharge through the thyratron, causing large surges of currents $i_T$ and $i_M$ as shown in FIGS. 2B and 2A, respectively. The pulse of current $i_M$ through the transverse magnetic field coil L4 generates the magnetic field 106 to temporarily extinguish the RSI current.

As the capacitors discharge, the shape of the magnetic field current pulse $i_M$ is partially smoothed and shaped, as shown in FIG. 2A, by pulse shaping inductor L3. A more extensive pulse shaping capability may be accomplished by adding additional pulse shaping inductors and capacitors to extend the ladder network pattern started by CL, L3, and C2. The pulse width and shape generated by such ladder networks is determined by design techniques well known in the art.

While the invention has been explained and described with reference to a preferred embodiment, numerous modifications thereof will be readily apparent to those skilled in the art without departing from the spirit and scope of the invention.

What is claimed is:

1. A pulse generator comprising a series loop connection of a power source, an inductive energy storage device, a spark gap, and a load device; and including a magnetic field controlled electronic switching device connected across the series connection of said spark gap and load element, and magnetic field generation means which produces a magnetic field for controlling said switching device, such that a pulse of said magnetic field causes said switching device to present an open circuit, thereby causing a spark to jump across said gap, so that an electrical pulse is delivered to said load device.

2. A high voltage pulse generation system comprising a voltage source connected in a series loop with an inductive energy storage device, a spark gap, and an electrically conductive load element, characterized in that:

a magnetic field controlled electronic current conduction and interruption device is connected across the series connection of said spark gap and load element, and a magnetic field pulse generation network connected to said voltage source provides a magnetic field for controlling said electronic current conduction and interruption device, whereby a current flowing through said inductive energy storage device is interrupted by a pulse of said magnetic field being applied to said current conduction and interruption device, so that a high voltage is generated across said spark gap, thus causing current conduction across the gap and resulting in a high voltage pulse being applied to said electrically conductive load element.

3. The system of claim 2, wherein said inductive energy storage device comprises an inductor, and said magnetic field controlled current conduction and interruption device comprises a repetitive series interrupter.

4. The system of claim 3, wherein said magnetic field pulse generation network comprises a magnetic field coil in series connection with a pulse shaping network, a charging inductor, and said voltage source, the junction connecting said pulse shaping network with said charging inductor also being connected to a first terminal of a voltage sensitive electronic switching device, a second terminal of which is connected to a terminal of said voltage source not connected to said charging inductor.

5. The system of claim 4, wherein said pulse shaping network comprises a single terminal pair ladder network, said network beginning with a capacitor connected across said terminal pair and continuing with one or more sections comprising a series inductor and a parallel capacitor.

6. The system of claim 4, wherein said voltage sensitive electronic switching device comprises a thyratron electronic tube.

* * * * *